United States Patent [19]
Matsuo et al.

[11] Patent Number: 5,235,218
[45] Date of Patent: Aug. 10, 1993

[54] SWITCHING CONSTANT CURRENT SOURCE CIRCUIT

[75] Inventors: Kenji Matsuo; Shinji Fujii; Yasukazu Noine; Kazuhiko Kasai, all of Yokohama, Japan

[73] Assignee: Kabushiki Kaisha Toshiba, Kawasaki, Japan

[21] Appl. No.: 791,379

[22] Filed: Nov. 14, 1991

[30] Foreign Application Priority Data

Nov. 16, 1990 [JP] Japan ................................. 2-310871

[51] Int. Cl.$^5$ ...................... H03K 17/16; H03K 17/20
[52] U.S. Cl. ................................. 307/443; 307/451; 307/296.8; 323/316
[58] Field of Search ............... 307/443, 448, 451, 494, 307/488, 451, 270, 296.5, 296.8; 323/315, 316

[56] References Cited

U.S. PATENT DOCUMENTS

| | | | |
|---|---|---|---|
| 4,495,425 | 1/1985 | McKenzie | 323/315 |
| 4,885,477 | 12/1989 | Bird et al. | 323/316 |
| 4,928,056 | 5/1990 | Pease | 307/296.8 |
| 5,087,891 | 2/1992 | Cytera | 307/296.8 |
| 5,124,632 | 6/1992 | Greaves | 307/296.8 |

FOREIGN PATENT DOCUMENTS 0262480  4/1988  European Pat. Off. .
0356570  3/1990  European Pat. Off. .

Primary Examiner—Edward P. Westin
Assistant Examiner—Andrew Sanders
Attorney, Agent, or Firm—Finnegan, Henderson, Farabow, Garrett & Dunner

[57] ABSTRACT

This invention discloses a switching constant current source circuit including a first current path for supplying a constant current, a first MOS transistor, one end of a current path of which is connected to the first current path, the other end of the current path of which is connected to a second current path, and a gate of which is applied with a digital signal corresponding to a logical amplitude, a second MOS transistor, one end of a current path of which is connected to the first current path, the other end of the current path of which is connected to a third current path, and which performs a switching operation complementary with the first MOS transistor, and level conversion means for fetching a change in voltage in the first current path caused by a change in current flowing through the first current path according to an operation of the first MOS transistor in response to the digital signal, and alternately applying a first level for disabling the second MOS transistor, which operates complementarily with the first MOS transistor, and a second level for enabling the second MOS transistor to output a predetermined current.

5 Claims, 4 Drawing Sheets

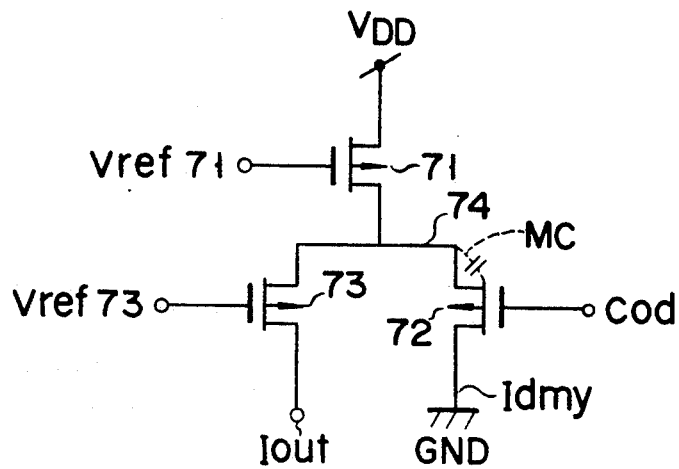
F I G. 1
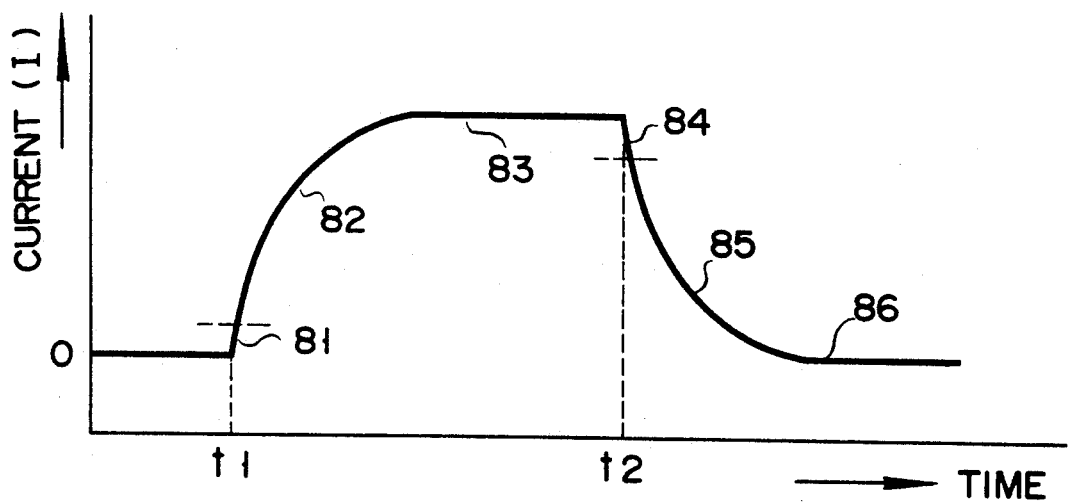
F I G. 2

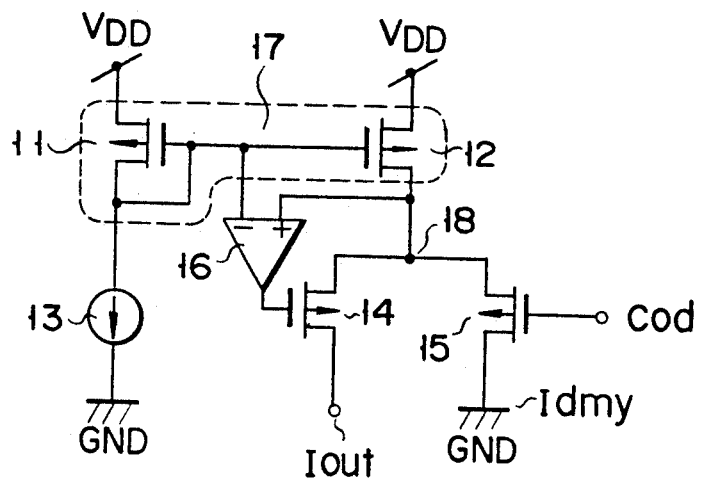
F I G. 3
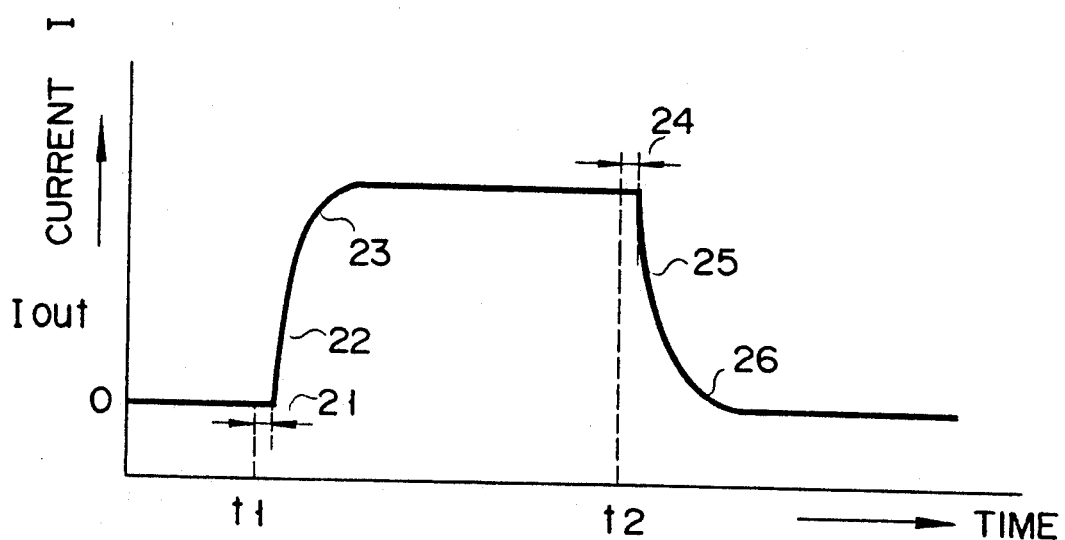
F I G. 4

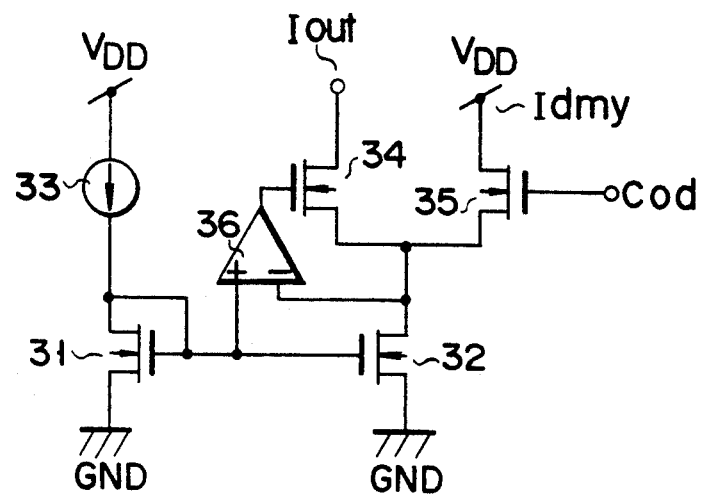
F I G. 5
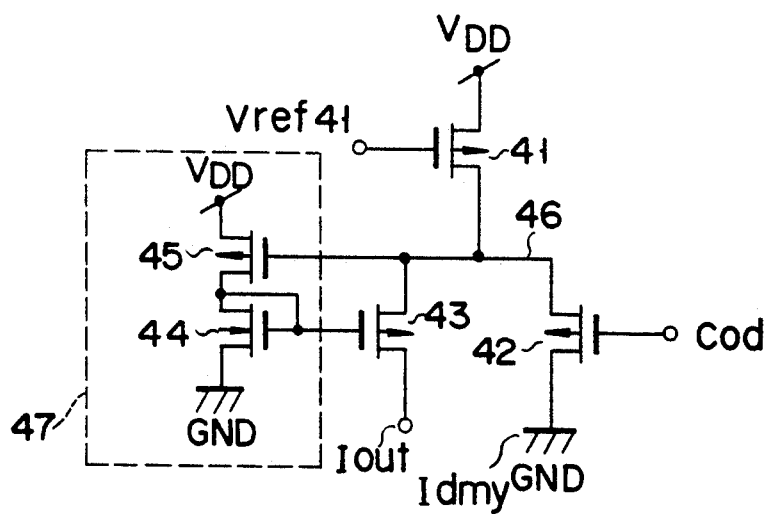
F I G. 6

5,235,218

SWITCHING CONSTANT CURRENT SOURCE CIRCUIT

BACKGROUND OF THE INVENTION

Field of the Invention

The present invention relates to a switching constant current source circuit, used especially in a unit current source for, e.g., a digital-to-analog converter, for outputting an arbitrarily set current value in accordance with, e.g., an externally input selection code.

Description of the Related Art

A switching constant current source circuit used in a DAC (digital-to-analog converter) is basically a circuit for always electrically connecting a current set at a predetermined value to one of a current output terminal and a dummy current output terminal by switching so as not to largely vary a current source.

FIG. 1 shows an arrangement of a conventional switching constant current source circuit, which is disclosed in U.S. Pat. No. 4,831,282.

The source of a p-channel MOS transistor 71 is connected to a power source voltage VDD. The gate of the transistor 71 is applied with a reference voltage Vref71. The drain of the transistor 71 is connected to the sources of p-channel MOS transistors 72 and 73. The gate of the transistor 72 is applied with a digital code Cod corresponding to "1" or "0" as a logical amplitude. The drain of the transistor 72 serves as a dummy current output terminal Idmy connected to a ground voltage GND. The gate of the transistor 73 is applied with a reference voltage Vref73. The drain of the transistor 73 is connected to a current output terminal Iout.

The operation of the circuit with the above arrangement will be described below with reference to an output waveform chart shown in FIG. 2.

In an output mode to the terminal Idmy, a digital code signal Cod for enabling the transistor 72 is applied to the gate of the transistor 72. If the ON resistance of the transistor 72 is smaller than the ON resistance of the transistor 73, most of the current is output to the terminal Idmy through the transistor 72. Therefore, in the output mode to the dummy current output terminal Idmy, the potential at a node 74 need only be lower than that at the node 74 in an output mode to the current output terminal Iout. Therefore, if the potential at that time is designed to be equal to or lower than the reference voltage Vref71, the transistor 73 is disabled, and current leakage can be prevented.

Thereafter, at time t1, a digital code signal Cod for disabling the transistor 72 is applied to the gate of the transistor 72. In this circuit, as indicated by reference numeral 81 (or 84) in FIG. 2, the influence of the mirror effect by a coupling capacitance MC serves to increase the ON/OFF operation speed in the transistor 72 upon switching based on the amplitude of the digital code signal Cod. Thus, when the potential at the node 74 is increased, and the gate-source voltage of the transistor 73 exceeds a threshold value, a current begins to flow to the current output terminal Iout. Thereafter, when the transistor 72 is completely disabled, the potential at the node 74 is increased according to a current flowing from the transistor 71. Therefore, the difference between the gate-source voltage and the drain-source voltage of the transistor 73 is increased in synchronism with the gradually increased potential at the node 74, and a stable current is output to the current output terminal Iout (reference numeral 83 in FIG. 2). The output current output from the current output terminal Iout at that time is determined by the ON resistances (low impedance) of the transistors 71 and 73 controlled by the predetermined reference voltages Vref71 and Vref73.

At time t2, a digital code signal Cod for enabling the transistor 72 is applied to the gate of the transistor 72. The switching operation of the transistor 72 is accelerated due to the influence of the mirror effect in the same manner as described above (reference numeral 84 in FIG. 2). The ON resistance of the transistor 72 becomes smaller than the ON resistance of the transistor 73, and most of the current flows to the dummy current output terminal Idmy. As a result, the potential at the node 74 is decreased, and the transistor 73 is disabled (reference numeral 86 in FIG. 2).

In this arrangement, since the reference voltage Vref73 as the gate bias of the transistor 73 is constant, the ON/OFF operation of the transistor 73 depends on a speed defined by the potential drift at the node 74 caused by the ON/OFF operation of the transistor 72. More specifically, the gate-drain voltage and the drain-source voltage of the transistor 73 are passively changed due to the potential drift at the node 74. For this reason, slow current changes indicated by reference numerals 82, 83, 85, and 86 in FIG. 2 disturb a high-speed operation.

In this manner, in the conventional circuit, since the gate-drain voltage and the drain-source voltage of the current output-side switching transistor are passively changed, a switching operation speed for outputting a current cannot be increased.

SUMMARY OF THE INVENTION

The present invention has been made in consideration of the above situation, and has as its object to provide a switching constant current source circuit capable of performing high-speed switching operation.

A switching constant current source circuit according to the present invention, comprises a first current path supplied with a constant current, a first MOS transistor, one end of which is connected to the first current path, the other end of which is connected to a second current path, and a gate of which is applied with a digital signal corresponding to a logical amplitude, a second MOS transistor, one end of which is connected to the first current path, the other end of which is connected to a third current path, and which is switched on when the first MOS transistor is disabled, and level conversion means for fetching a change in voltage in the first current path according to an ON/OFF operation of the first MOS transistor based on the digital signal, and selectively applying, to the gate of the second MOS transistor, a first level for disabling the second MOS transistor or a second level for enabling the second MOS transistor to output a constant current.

The present invention applies a variable gate bias to the second MOS transistor by utilizing the fact that the first MOS transistor, which is enabled/disabled in response to a digital signal, gives a change in voltage in the first current path. Thus, the ON/OFF operation of the second MOS transistor is positively controlled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram of a conventional switching constant current source circuit;

FIG. 2 is current output waveform chart showing an operation of the circuit shown in FIG. 1;

FIG. 3 is a circuit diagram of a switching constant current source circuit according to the first embodiment of the present invention;

FIG. 4 is a current output waveform chart showing an operation of the circuit shown in FIG. 3;

FIG. 5 is a circuit diagram of a switching constant current source circuit according to the second embodiment of the present invention;

FIG. 6 is a circuit diagram of a switching constant current source circuit according to the third embodiment of the present invention.

DETAILED DESCRIPTION OF THE PREFERRED EMBODIMENTS

Figure 7:
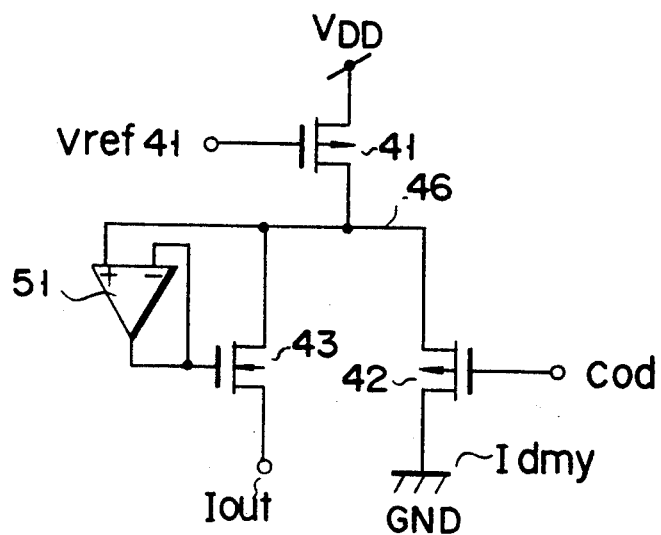
FIGS. 7 and 8 are circuit diagrams showing modifications of FIG. 4.

The preferred embodiments of the present invention will be described hereinafter with reference to the accompanying drawings.

FIG. 3 is a circuit diagram showing an arrangement according to the first embodiment of the present invention. The sources of p-channel MOS transistors 11 and 12 are connected to a power source voltage VDD. The gates of the transistors 11 and 12 are commonly connected to each other. The gate and the drain of the transistor 11 are connected to each other. The drain of the transistor 11 is connected to a ground voltage GND through a constant current source 13. More specifically, the transistors 11 and 12 constitute a current mirror circuit for the constant current source 13. The drain of the transistor 12 is connected to the sources of p-channel MOS transistors 14 and 15. The gate of the transistor 15 is applied with a digital code signal Cod corresponding to "1" or '0" as a logical amplitude. The drain of the transistor 15 is connected to the ground voltage GND, and serves as a dummy current output terminal Idmy. The gate of the transistor 14 is connected to the output terminal of an amplifier 16. The non-inverting input terminal of the amplifier 16 is connected to the common gate of the transistors 11 and 12, and the inverting input terminal thereof is connected to the drain of the transistor 12. The drain of the transistor 14 is connected to a current output terminal Iout.

The operation of the circuit with the above arrangement will be described below with reference to the current output waveform chart shown in FIG. 4.

When current is output to the dummy current output terminal Idmy, the transistor 15 receives a code input for cutting off the transistor 15 at time t1. At this time, the potential at a node 18 is instantaneously; rapidly increased due to the mirror effect of the coupling capacitance of the transistor 15. The amplifier 16 senses the slight potential rise at the node 18 after a short operation delay period 21, and the output from the amplifier 16 changes to about 0 V at which the transistor 14 is enabled. Thus, a current is rapidly increased, as indicated by reference numeral 22 in FIG. 4. Thereafter, the amplifier 16 operates, so that the potential at a node 17 gradually becomes equal to the potential at the node 18. Thus, the output is initially increased at an inclination indicated by reference numeral 22, and the increase in output is rapidly reduced so as to suppress a glitch, as indicated by reference numeral 23.

When a current is output along a path of the current output terminal Iout, the amplifier 16 applies a bias (imaginary short bias) for equalizing the voltages at the nodes 17 and 18 to the transistor 14. Therefore, in this state, the drain voltage of the transistor 12 is controlled, so that the operation state of the transistor 11 as a reference current source and the operation state of the transistor 12 as a current mirror become equal to each other.

Thereafter, when the transistor 15 receives a code input for enabling the transistor 15 at time t2, the potential at the node 17 is rapidly decreased due to the mirror effect of the coupling capacitance. After a short delay period 24 of the output operation of the amplifier 16, the output from the current output terminal Iout rapidly changes, as indicated by reference numeral 25, and the change in output is then decelerated and stabilized, as indicated by reference numeral 26.

As a result, current paths can be switched at high speed, and a current can be stably output to the current output terminal Iout. When a current is output to the current output terminal Iout, the drain-source voltages of the transistors 11 and 12 are equal to each other due to the imaginary short bias from the amplifier 16, thus achieving a precise current mirror circuit.

FIG. 5 is a circuit diagram showing an arrangement according to the second embodiment of the present invention. In this embodiment, the present invention is applied to a current pull-in type circuit. In place of the p-channel MOS transistors 11, 12, 14, and 15, n-channel MOS transistors 31, 32, 34, and 35 are used. In addition, in place of the amplifier 16 and the constant current source 13, an amplifier 36 and a constant current source 33 are connected at corresponding positions like in FIG. 3.

FIG. 6 is a circuit diagram showing an arrangement according to the third embodiment of the present invention. In this embodiment, a level conversion circuit 47 for controlling an output switching transistor at a current output terminal Iout utilizes the nature of a cascade circuit, while a corresponding circuit in FIG. 3 utilizes the nature of an operational amplifier.

The source of a p-channel MOS transistor 41 is connected to a power source voltage VDD. The gate of the transistor 41 is applied with a reference voltage Vref41. The drain of the transistor 41 is connected to the sources of p-channel MOS transistors 42 and 43. The gate of the transistor 42 is applied with a digital code signal Cod corresponding to "1" or "0" as a logical amplitude. The drain of the transistor 42 serves as a dummy current output terminal Idmy connected to a ground voltage GND. The drain of the transistor 43 is connected to a current output terminal Iout. The gate of the transistor 43 is connected to the gate and drain of an n-channel MOS transistor 44. The drain of the transistor 44 is connected to the drain of a p-channel MOS transistor 45, whose source is connected to the lower source voltage VDD. The gate of the transistor 45 is connected to a node 46 to which a parallel circuit of the transistors 42 and 43 is connected. The transistors 44 and 45 constitute a level conversion circuit 47 for controlling the gate of the transistor 43.

The circuit with the above arrangement operates in the same manner as in the circuit with the arrangement shown in FIG. 3. More specifically, a change in voltage at the node 46 according to an ON/OFF operation of the transistor 42 based on the code signal Cod is received by the gate of the transistor 45. Thus, the transistor 44 changes the gate bias of the transistor 43. More specifically, the level conversion circuit 47 selectively applies, to the gate of the transistor 43, a level signal for disabling the transistor 43 or a predetermined level signal for causing the transistor 43 to output a constant current, in accordance with the ON/OFF operation of the transistor 42. In this manner, a high-speed, stable switching constant current source circuit with high precision can be realized with a relatively small increase in the number of elements.

Figure 8:
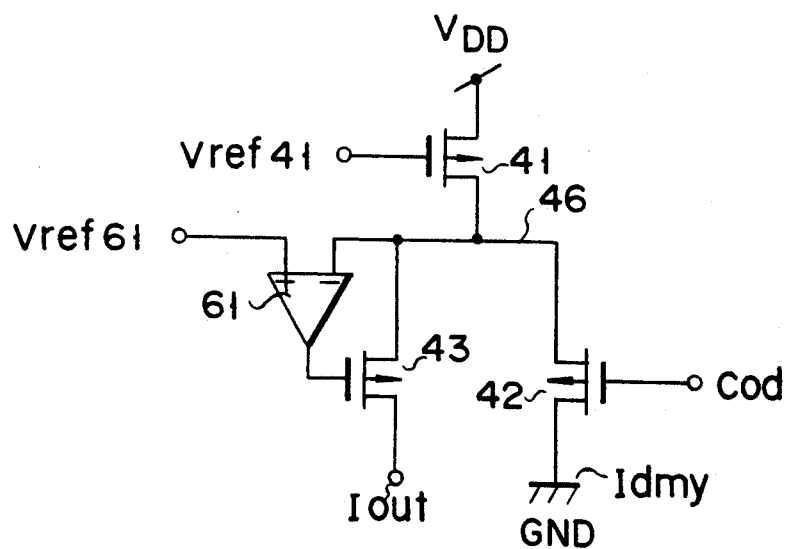

FIGS. 7 and 8 show modifications of the level conversion circuit 47 in the arrangement shown in FIG. 6. The same reference numerals in FIGS. 7 and 8 denote the same parts as in the arrangement shown in FIG. 6, and a detailed description thereof will be omitted.

In FIG. 7, the level conversion circuit 47 in the arrangement shown in FIG. 6 is constituted by an amplifier 51. The non-inverting input terminal of the amplifier 51 is connected to the node 46, and the inverting input terminal and the output terminal thereof are connected to the gate of the transistor 43. The drain of the transistor 43 is connected to the node 46, and the source thereof is connected to the current output terminal Iout.

In FIG. 8, an amplifier 61 is arranged. The noninverting input terminal of the amplifier 61 receives a predetermined reference voltage Vref61. The inverting input terminal of the amplifier 61 is connected to the node 46, and the output terminal thereof is connected to the gate of the transistor 43.

In this manner according to the circuits of the above embodiments, the current paths can be switched at high speed, and a current mirror circuit, which can stably output a current to the terminal Iout, and has high precision, can be realized.

As described above, according to the present invention, a variable gate bias is applied upon switching of a current, thereby positively controlling the ON/OFF operation of a transistor. Thus, a switching constant current source circuit, which can switch current paths at higher speed, and can perform a high-speed operation, can be provided.

Additional advantages and modifications will readily occur to those skilled in the art. Therefore, the invention in its broader aspects is not limited to specific details, and representative devices, shown and described herein. Accordingly, various modifications may be made without departing from the spirit or scope of the general inventive concept as defined by the appended claims and their equivalents.

What is claimed is:

1. A switching constant current source circuit comprising:
    a first current path for supplying a constant current;
    a first MOS transistor, one end of a current path of which is connected to said first current path, the other end of said current path of which is connected to a second current path, and a gate of which is applied with a digital signal corresponding to a logical amplitude;
    a second MOS transistor, one end of a current path of which is connected to said first current path, the other end of said current path of which is connected to a third current path, and which performs a switching operation complementary with said first MOS transistor; and
    level conversion means responsive to a change in voltage in said first current path caused by a change in current flowing through said first current path according to an operation of said first MOS transistor in response to the digital signal, and alternately applying a first level for disabling said second MOS transistor, which operates complementarily with said first MOS transistor, and a second level for enabling said second MOS transistor to output a predetermined current.

2. A circuit according to claim 1, wherein said level conversion means comprises a third MOS transistor serving as a reference source, a fourth MO transistor constituting a current mirror circuit together with said third MOS transistor, and an amplifier, a non-inverting input terminal thereof is connected to a common gate of said third and fourth transistors, an inverting input terminal thereof is connected to a node of the current paths of said first, second, and fourth MOS transistors, and an output terminal of which is connected to a gate of said second MOS transistor.

3. A circuit according to claim 1, wherein said level conversion means comprises a third MOS transistor, a gate of which is connected to said first current path, and a fourth MOS transistor which is connected in series with said third MOS transistor.

4. A circuit according to claim 1, wherein said level conversion means comprises an amplifier, a non-inverting input terminal of which is connected to said first current path, and an inverting input terminal and an output terminal of which are connected to a gate of said second MOS transistor.

5. A circuit according to claim 1, wherein said level conversion means comprises an amplifier, a non-inverting input terminal of which is connected to a reference potential, an inverting input terminal of which is connected to said first current path, and an output terminal of which is connected to said second MOS transistor.

* * * * *